(12) United States Patent
Kuo et al.

(10) Patent No.: US 10,396,649 B2
(45) Date of Patent: Aug. 27, 2019

(54) SWITCHING DEVICE AND SWITCHING APPARATUS INCLUDING THE SAME

(71) Applicants: Asian H.Y. Nano Technology Co., Ltd., Taichung (TW); Chun-Lin Kuo, Taichung (TW); Po-Chia Kuo, Taichung (TW)

(72) Inventors: Po-Yuan Kuo, Taichung (TW); Chun-Lin Kuo, Taichung (TW); Po-Chia Kuo, Taichung (TW)

(73) Assignees: ASIAN H.Y. NANO TECHNOLOGY CO., LTD., Taichung (TW); Chun-Lin Kuo, Taichung (TW); Po-Chia Kuo, Taichung (TW)

( * ) Notice: Subject to any disclaimer, the term of this patent is extended or adjusted under 35 U.S.C. 154(b) by 249 days.

(21) Appl. No.: 15/677,225

(22) Filed: Aug. 15, 2017

(65) Prior Publication Data

US 2018/0316254 A1 Nov. 1, 2018

(30) Foreign Application Priority Data

Apr. 28, 2017 (CN) .......................... 2017 1 0295441

(51) Int. Cl.
| | | |
|---|---|---|
| *H02H 7/00* | (2006.01) | |
| *H02M 1/08* | (2006.01) | |
| *H02H 7/12* | (2006.01) | |
| *H02S 40/32* | (2014.01) | |
| *H02M 1/32* | (2007.01) | |
| *H01L 31/02* | (2006.01) | |
| *H02S 40/30* | (2014.01) | |
| *H02M 3/156* | (2006.01) | |
| *H02M 1/00* | (2006.01) | |

(52) U.S. Cl.
CPC ........ *H02M 1/08* (2013.01); *H01L 31/02021* (2013.01); *H02H 7/1213* (2013.01); *H02M 1/32* (2013.01); *H02S 40/30* (2014.12); *H02S 40/32* (2014.12); *H02M 3/156* (2013.01); *H02M 2001/0022* (2013.01); *H02M 2001/0048* (2013.01)

(58) Field of Classification Search
None
See application file for complete search history.

(56) References Cited

U.S. PATENT DOCUMENTS

| | | | |
|---|---|---|---|
| 6,111,767 A * | 8/2000 | Handleman | G05F 1/67 136/293 |
| 8,405,367 B2 * | 3/2013 | Chisenga | H02J 3/383 323/207 |

(Continued)

*Primary Examiner* — Stephen W Jackson
(74) *Attorney, Agent, or Firm* — Birch, Stewart, Kolasch & Birch, LLP

(57) ABSTRACT

A switching device for stabilizing an electric output of a solar panel is provided, and includes a voltage converter circuit, a switch circuit connected between the solar panel and the voltage converter circuit, and a control unit. The voltage converter circuit converts input voltage and current received from the solar panel through the switch circuit into output voltage and current. The control unit calculates an input electric power and an output electric power based on values of the input voltage and current and values of the output voltage and current, and controls the switch circuit to switch between a closed state and an open state according to the input electric power and the output electric power.

18 Claims, 7 Drawing Sheets

(56) References Cited

U.S. PATENT DOCUMENTS

| | | | |
|---|---|---|---|
| 8,674,668 B2 * | 3/2014 | Chisenga | H02M 3/156 323/266 |
| 8,773,077 B1 * | 7/2014 | Elmes | H02J 7/0072 320/128 |
| 9,496,803 B2 * | 11/2016 | Chisenga | H02M 3/156 |

* cited by examiner

SWITCHING DEVICE AND SWITCHING APPARATUS INCLUDING THE SAME

CROSS-REFERENCE TO RELATED APPLICATION

This application claims priority of Chinese Patent Application No. 201710295441.2, filed on Apr. 28, 2017.

FIELD

The disclosure relates to a switching device and a switching apparatus including the same, and more particularly to a switching device for stabilizing an electric output of a solar panel.

BACKGROUND

In recent years, because of the limited reserves of petroleum on Earth, green energy technology has been developed quickly. Particularly, solar energy is one of the main research subjects because it is easy to obtain and does not cause environmental pollution when used to generate electricity.

Referring to FIGS. 1 and 2, a first conventional solar power system includes a plurality of solar panels 11, and a power adjusting device 12 that includes a voltage converting circuit 121. The solar panels 11 are electrically connected in series in order to generate a total output voltage that is higher than an output voltage of a single one of the solar panels 11. However, when one of the solar panels 11 malfunctions due to aging or is broken (e.g., the solar panel 111 in FIG. 1), the solar panels 11 form an open circuit and cannot operate normally. When some of the solar panels 11 are covered, for example by a shadow 112 of tree leaves or by bird's droppings 113, total current generated by the solar panels 11 is reduced so that power generating efficiency of the first conventional solar power system drops.

To overcome the above problems, a second conventional solar power system is provided (see FIG. 3). The second conventional solar power system is shown to be similar to the first solar power system, and also includes a plurality of the solar panels 11 and the power adjusting device 12 including the voltage converting circuit 121. The only difference from the first conventional solar power system is that the solar panels 11 of the second conventional solar power system are electrically connected in parallel with one another. With this configuration, the conventional solar power system can still operate when one of the solar panels 11 malfunctions, but the total current generated by the solar panels 11 as well as the power generating efficiency of the first conventional solar system will be reduced. Further, the problem of reduction of the total current generated by the solar panels 11 with some of them being covered remains unsolved.

To further improve the first and second solar power systems, a third conventional solar power system is provided (see FIG. 4). The third conventional solar power system further includes a plurality of diodes 122. Each of the diodes 122 is electrically connected between a respective one of the solar panel 11 and the power adjusting device 12. By virtue of the diodes 122, output current of an abnormal one of the solar panels 11 which generates electricity with efficiency (output voltage) lower than other solar panels 11 cannot flow through a corresponding one of the diodes 122. Therefore, the abnormal solar panel 11 does not negatively affect overall output voltage outputted by the third conventional solar power system. However, when most of the solar panels 11 operate abnormally or are covered, they are disconnected from the power adjusting device 12 by corresponding ones of the diodes 122 and do not provide output current to the power adjusting device 12. Consequently, the power generating efficiency of the third conventional solar system significantly drops.

SUMMARY

Therefore, an object of the disclosure is to provide a switching device that can alleviate at least one of the drawbacks of the prior arts.

According to the disclosure, the switching device is to be electrically connected to a solar panel for stabilizing an electric output of the solar panel. The switching device includes a switch circuit, a voltage converter circuit and a control unit.

The switch circuit is operable to switch between a closed state and an open state, and includes a first node that is configured to be electrically connected to the solar panel for receiving input voltage and input current therefrom, and a second node.

The voltage converter circuit is electrically connected to the second node for receiving the input voltage and the input current from the switch circuit when the switch circuit is in the closed state, and is configured to convert the input voltage and the input current into output voltage and output current.

The control unit is electrically connected to the switch circuit and the voltage converter circuit, and is configured to measure an input voltage value of the input voltage, an input current value of the input current, an output voltage value of the output voltage, and an output current value of the output current. The control unit is further configured to calculate an input electric power based on the input voltage value and the input current value, to calculate an output electric power based on the output voltage value and the output current value, and to control the switch circuit to switch between the closed state and the open state according to the input electric power and the output electric power.

Another object of the disclosure is to provide a switching apparatus that can alleviate at least one of the drawbacks of the prior arts.

According to the disclosure, the switching apparatus includes a plurality of switching devices. Each of the switching devices is electrically connected to a solar panel for stabilizing an electric output of the solar panel. Each of the switching devices includes a switch circuit, a voltage converter circuit and a control unit.

The switch circuit is operable to switch between a closed state and an open state, and includes a first node that is configured to be electrically connected to the solar panel for receiving input voltage and input current therefrom, and a second node.

The voltage converter circuit is electrically connected to the second node for receiving the input voltage and the input current from the switch circuit when the switch circuit is in the closed state, and is configured to convert the input voltage and the input current into output voltage and output current.

The control unit is electrically connected to the switch circuit and the voltage converter circuit, and is configured to measure an input voltage value of the input voltage, an input current value of the input current, an output voltage value of the output voltage, and an output current value of the output current. The control unit is further configured to calculate an input electric power based on the input voltage value and the input current value, to calculate an output electric power based on the output voltage value and the output current value, and to control the switch circuit to switch between the closed state and the open state according to the input electric power and the output electric power.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
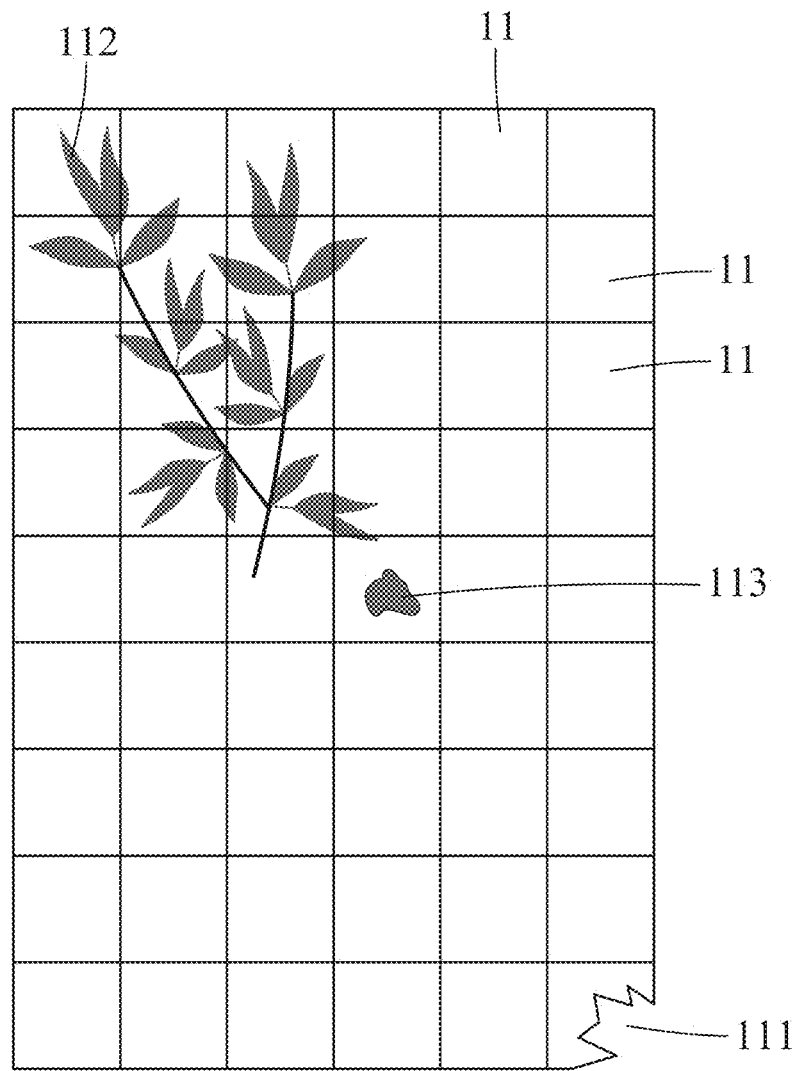
FIG. 1 is a schematic view illustrating solar panels of a first conventional solar power system.
Figure 2:
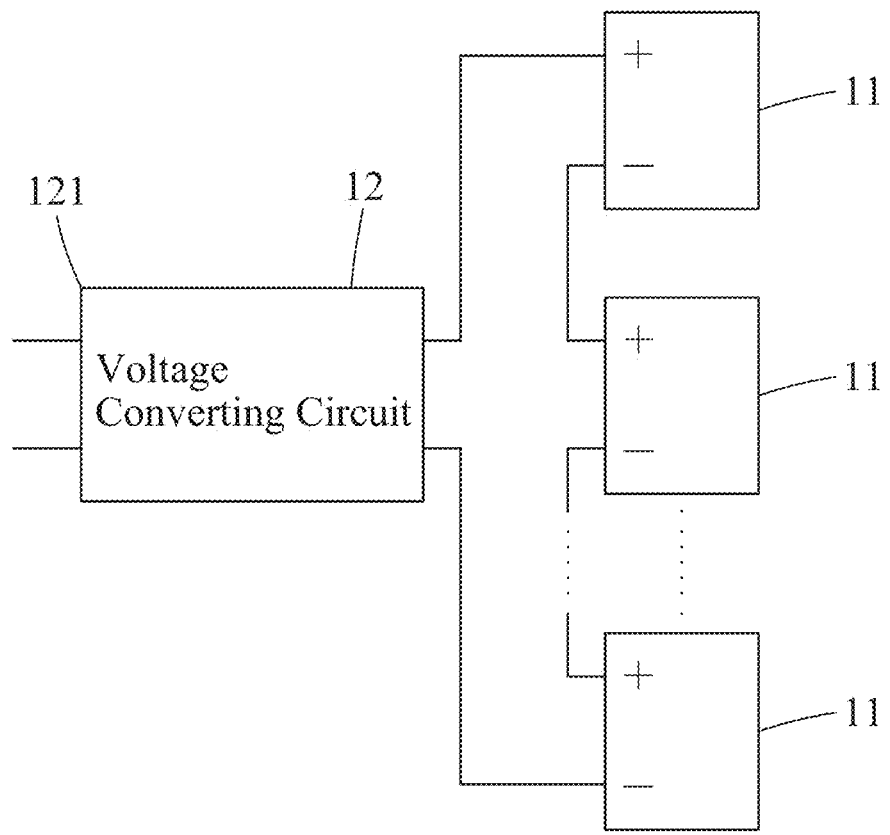
FIG. 2 is a schematic block diagram of the first conventional solar power system.
Figure 3:
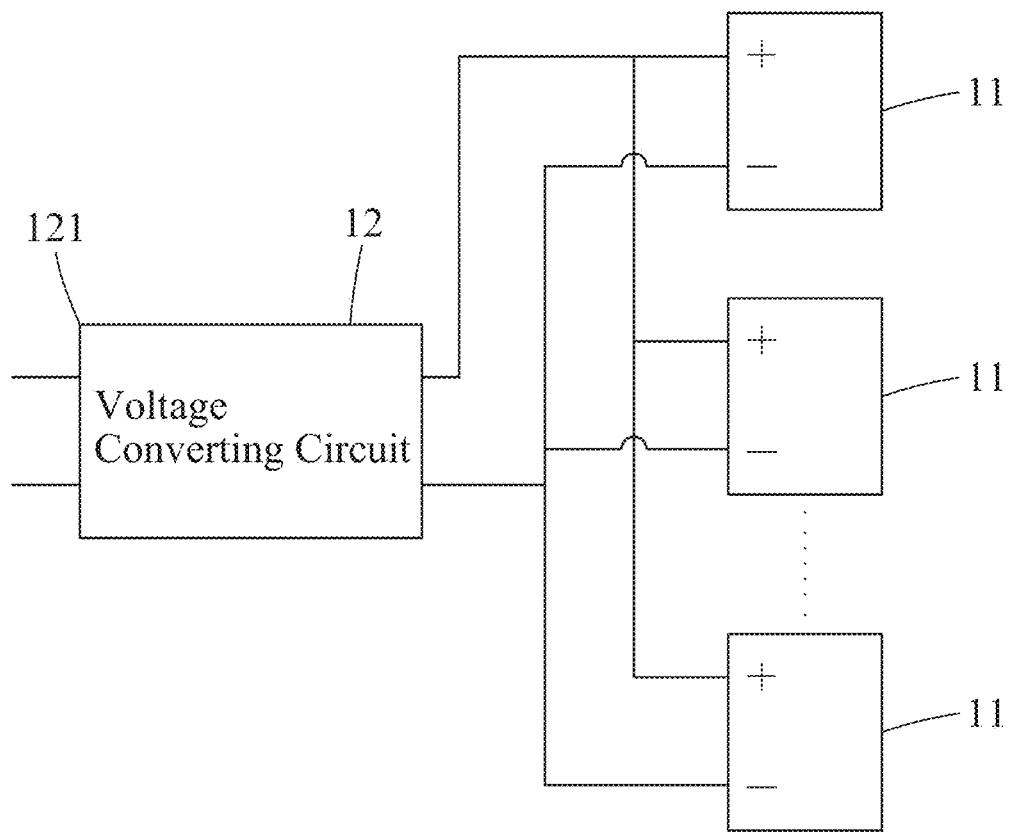
FIG. 3 is a schematic block diagram of a second conventional solar power system.
Figure 4:
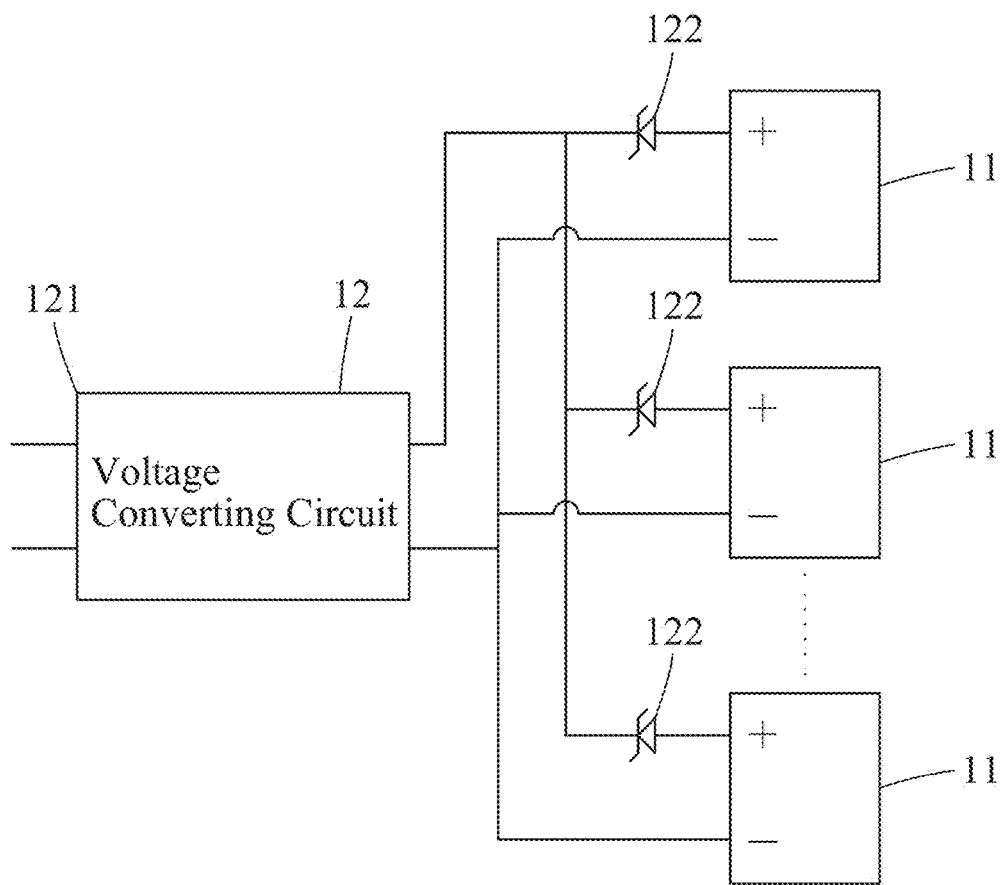
FIG. 4 is a schematic block diagram of a third conventional solar power system.
Figure 5:
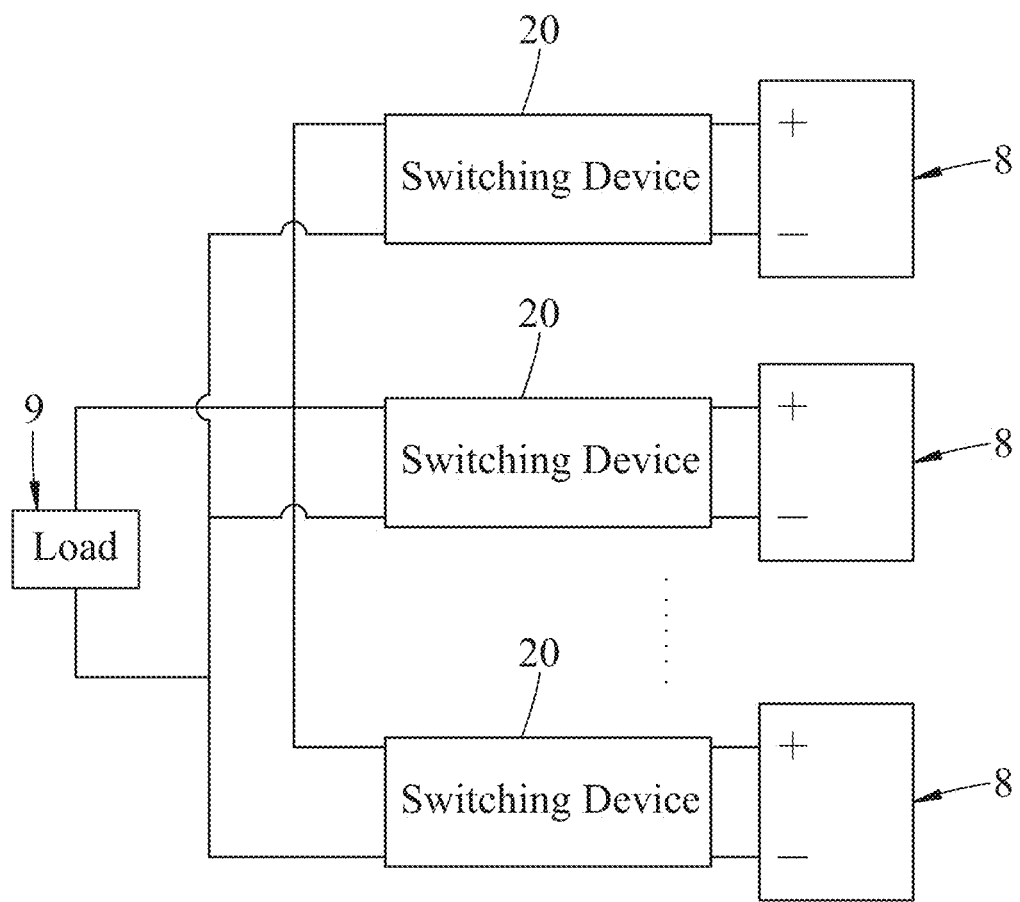
FIG. 5 is a schematic block diagram of a solar power system according to one embodiment of the disclosure.
Figure 6:
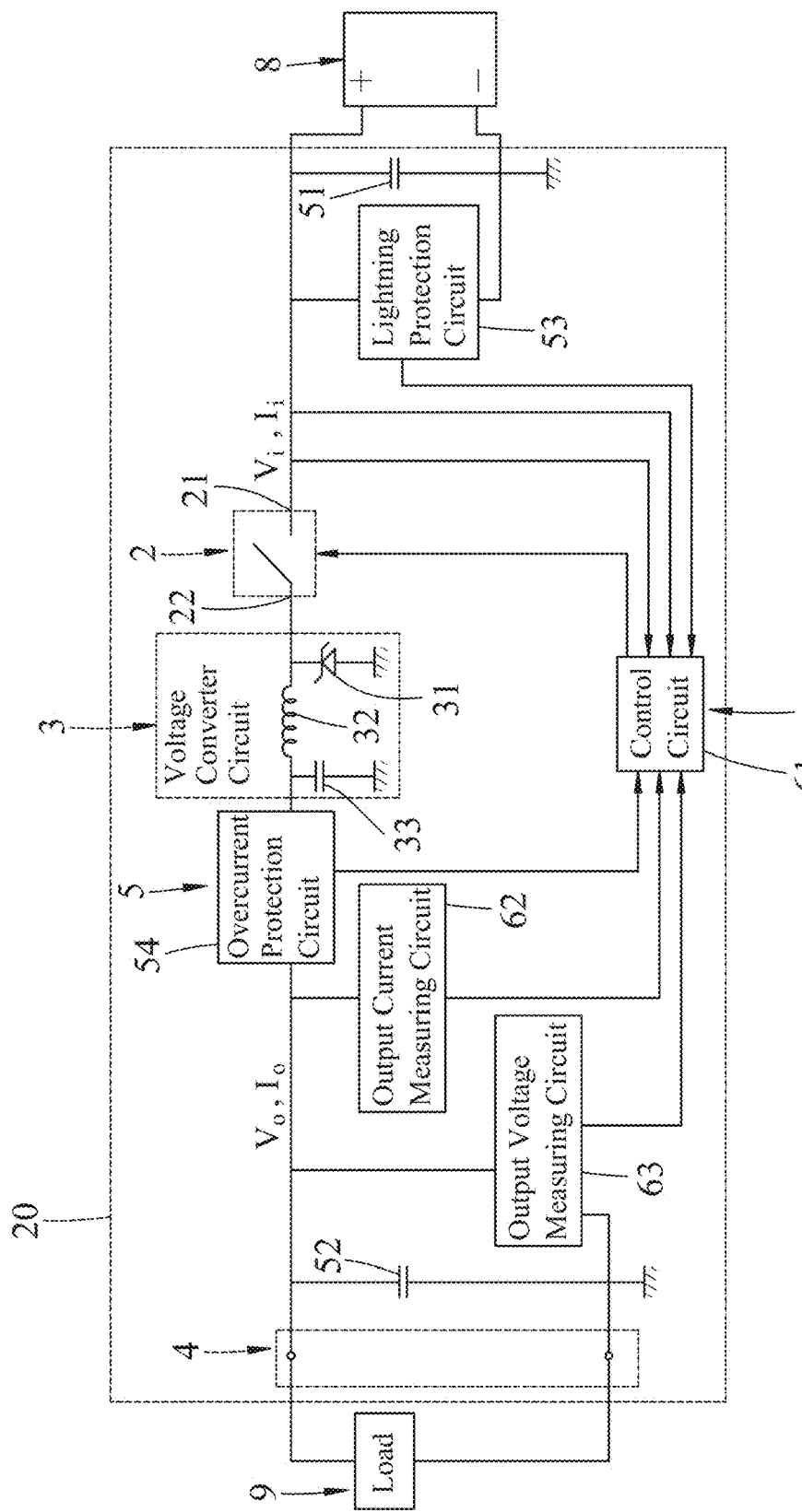
FIG. 6 is a schematic block diagram of a switching devices used in the solar power system according to one embodiment of the disclosure.

Referring to FIGS. 5 and 6, a solar power system according to one embodiment of this disclosure includes a plurality of solar panels 8, and a switching apparatus electrically connected to the solar panels 8. Each of the solar panels 8 is configured to output an electric output having input voltage and input current. The switching apparatus includes a plurality of switching devices 20. The switching devices 20 are electrically connected in parallel with one another, and are electrically connected to the solar panels 8, respectively. For example, one solar panel 8 and one switching device 20 may be bundled as a tie-in set, or a plurality of tie-in sets of the solar panel 8 and the switching device 20 may be sold together.

Each switching device 20 is used for stabilizing the electric output of a corresponding one of the solar panels 8. Each switching device 20 includes a switch circuit 2, a voltage converter circuit 3, an output interface 4, a protection circuit 5 and a control unit 6.

The switch circuit 2 is operable to switch between a closed state and an open state. The switch circuit 2 includes a first node 21 and a second node 22. The first node 21 is electrically connected to the solar panel 8 for receiving the input voltage and the input current therefrom.

The voltage converter circuit 3 is electrically connected to the second node 22 for receiving the input voltage and the input current from the switch circuit 2 when the switch circuit 2 is in the closed state. The voltage converter circuit 3 is configured to convert the input voltage and the input current into output voltage and output current, respectively. In this embodiment, the voltage converter circuit 3 is a buck converter circuit that includes a diode 31, an inductor 32 and a capacitor 33. It should be noted that the voltage converter circuit 3 is not limited to this embodiment, and circuit components and configuration may be varied according to different demands.

The output interface 4 is electrically connected to the voltage converter circuit 3 for transmitting the output voltage and the output current from the voltage converter circuit 3 to a load 9. For example, the output interface 4 includes two terminals electrically connected to the load 9.

The protection circuit 5 includes an input capacitor 51, an output capacitor 52, a lightning protection circuit 53 and an overcurrent protection circuit 54. The input capacitor 51 and the lightning protection circuit 53 are electrically connected in parallel with the solar panel 8. The output capacitor 52 is electrically connected in parallel with the output interface 4. The lightning protection circuit 53 is configured for detecting a surge. The overcurrent protection circuit 54 is electrically connected between the voltage converter circuit 3 and the output interface 4 for detecting an output current value ($I_o$) of the output current.

The control unit 6 includes a control circuit 61, an output voltage measuring circuit 63 and an output current measuring circuit 62. The output voltage measuring circuit 63 and the output current measuring circuit 62 are electrically connected to the control circuit 61 and the output interface 4, and are configured to measure an output voltage value ($V_o$) of the output voltage and the output current value ($I_o$) of the output current, respectively, and to transmit the output voltage value ($V_o$) and the output current value ($I_o$) to the control circuit 61. The control circuit 61 is electrically connected to solar panel 8, and is configured to measure an input voltage value ($V_i$) of the input voltage and an input current value ($I_i$) of the input current outputted by the solar panel 8, and to calculate an input electric power and an output electric power. The input electric power is calculated based on the input voltage value ($V_i$) and the input current value ($I_i$). Similarly, the output electric power is calculated based on the output voltage value ($V_o$) and the output current value ($I_o$). The control circuit 61 is further configured to output a control signal to the switch circuit 2 so as to control the switch circuit 2 to switch between the closed state and the open state according to the input electric power and the output electric power. For example, the control circuit 61 is a programmable logic device.

Specifically, the control circuit 61 is configured to repeatedly calculate the input electric power when the switch circuit 2 is in the closed state, to repeatedly calculate a rate of change of the input electric power, and to control the switch circuit 2 to switch to the open state upon a change in the rate of change of the input electric power from a positive value to a negative value. The control circuit 61 calculates the input electric power at successive time points with a specific interval based on $$W_i = \int_0^T I_i(t) V_i(t) dt$$

where $W_i$ denotes the input electric power, $V_i$ denotes the input voltage value, $I_i$ denotes the input current value, and T denotes the specific interval.

Similarly, the control circuit 61 is configured to repeatedly calculate the output electric power when the switch circuit 2 is in the open state, to repeatedly calculate a rate of change of the output electric power, and to control the switch circuit 2 to switch to the closed state upon a change in the rate of change of the output electric power from a positive value to a negative value. The control circuit 61 calculates the output electric power at successive time points with the specific interval (T) based on $$W_o = \int_0^T I_o(t) V_o(t) dt$$

where $W_o$ denotes the output electric power, $V_o$ denotes the output voltage value, and $I_o$ denotes the output current value.

It should be noted that the control circuit 61 calculates the input electric power and the output electric power with the same specific interval (T) in this embodiment. However, in other embodiments, the control circuit 61 may calculate the input electric power and the output electric power with different intervals.

Furthermore, to prevent the switching device 20 from being damaged by lightning or overcurrent, the control circuit 61 receives a value of the surge detected by the lightning protection circuit 53, and is configured to control the switch circuit 2 to operate in the open state when the value of the surge received from the lightning protection circuit 53 is greater than a surge threshold. For example, the surge may be a voltage spike or a surge current. The control circuit 61 also receives the output current value ($I_o$) of the output current detected by the overcurrent protection circuit 54, and controls the switch circuit 2 to operate in the open state when the output current value ($I_o$) received from the overcurrent protection circuit 54 is greater than a current threshold.

In practical use, the switching devices 20 are electrically connected the solar panels 8, respectively, and are all electrically connected to the load 9.

Figure 7:
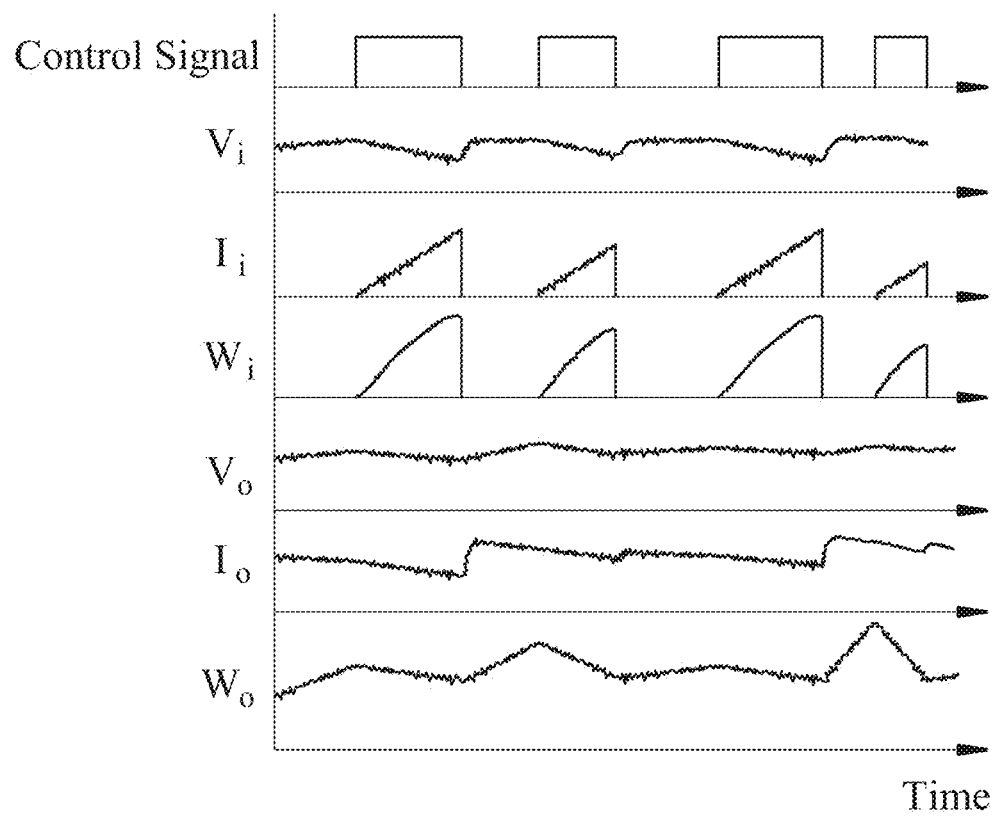
FIG. 7 is a timing diagram illustrating control signals, input current values, input voltage values, values of input electric power, output current values, output voltage values and values of output electric power.

Further referring to FIG. 7, when the control signal that is outputted by the control circuit 61 to the switch circuit 2 is in a high voltage level, the switch circuit 2 is controlled to operate in the closed state, the input current value ($I_i$) of the input current increases gradually as being affected by the inductor 32, and the input voltage value ($V_i$) of the input voltage gradually decreases, so that the input electric power ($W_i$) may increase. When the input voltage value ($V_i$) of the input voltage decreases to a critical point making the rate of change of the input electric power ($W_i$) change from a positive value to a negative value, and the control unit 6 immediately outputs the control signal in a low voltage level so as to control the switch circuit 2 to operate in the open state.

When the switch circuit 2 is operated in the open state, the output voltage value ($V_o$) of the output voltage gradually increases because of the inductor 32, and the output current value ($I_o$) of the output current gradually decreases, so that the output electric power ($W_o$) may increase. When the output current value ($I_o$) decreases to a critical point making the rate of change in the output electric power change from a positive value to a negative value, the control unit 6 immediately outputs the control signal in the high voltage level so as to control the switch circuit 2 to operate in the closed state.

Therefore, by doing so, the input electric power ($W_i$) and the output electric power ($W_o$) are raised up to a maximum value, so overall electric output of the solar power system is optimized. It should be noted that a total area under curves of the input electric power ($W_i$) shown in FIG. 7 is positively correlated with the input current value ($I_i$), the input voltage value ($V_i$) and strength of sunlight, and an area under a curve of the output electric power ($W_o$) in FIG. 7 is positively correlated with the output voltage value ($V_o$), and the output current value ($I_o$) that is related to the load 9.

Furthermore, when the load 9 is removed from the solar power system and the solar panels 8 are still outputting the electric outputs, the output current(s) outputted by the switching device(s) 20 with higher output voltage value may flow (backfeed) to the switching device (s) 20 outputting the output voltage(s) with lower output voltage value since the switching devices 20 are electrically connected to one another in parallel. However, current backfeeding may cause internal loss of energy in the solar power system. To prevent the internal loss caused by the current backfeeding, the control circuit 61 is configured to control the switch circuit 2 to operate in the open state when the output voltage value ($V_o$) is greater than a first predetermined voltage value, and to operate in the closed state when the output voltage value is less than a second predetermined voltage value that is less than the first predetermined voltage value. In particular, since each of the switching devices 20 is designed to include the buck converter circuit (i.e., the voltage converter circuit 3), the output voltage value ($V_o$) may be close to the input voltage value ($V_i$) when the load 9 is removed, and may be reduced to be close to an operating voltage value desired by the load 9 when the load 9 is electrically connected. Therefore, the first predetermined voltage value and the second predetermined voltage value can be defined around the input voltage value ($V_i$) and the operating voltage value, respectively. When the load 9 is removed, the output voltage increases and the output voltage value ($V_o$) becomes greater than the first predetermined voltage value, and accordingly, the control unit 6 controls the switch circuit 2 to operate in the open state to prevent the internal loss. When the load 9 is reconnected to the solar power system, the output voltage decreases and the output voltage value ($V_o$) becomes less than the second predetermined voltage value, and accordingly, the control unit 6 controls the switch circuit 2 to operate in the closed state to output electricity to the load 9.

In summary, the switching device 20 according to the embodiment of this disclosure provides the following advantages.

The switch circuit 2 is controlled to switch to the open state upon the input electric power starting to decrease, and to switch to the closed state upon the output electric power starting to decrease. Therefore, overall efficiency of power generation of the solar power system is optimized.

The user can buy one single tie-in set of one solar panel 8 and one switching device 20, or buy multiple sets altogether if necessary. Compared with the power adjusting device 12 of the conventional solar power systems where all of the solar panels 11 are electrically connected to the single one power adjusting device 12, each solar panel 8 is electrically connected to one switching device 20; that is to say, the solar panel 8 and the switching device 20 can be modularized. It is more convenient to the user to install and maintain the solar power system, and is more cost friendly to a purchaser who only needs a few of the solar panels 8 and the switching devices 20. Further, compared with the power adjusting device 12 of the conventional solar power systems, the circuit of the switching device 20 according to the disclosure is relatively simple and is designed on a basis of a low power circuit.

Furthermore, to prevent the internal losses caused by the current backfeeding, the control unit 6 can control the switch circuit 2 to operate in the open state when the output voltage value ($V_o$) is greater than the first predetermined voltage value, and to operate in the closed state when the output voltage value ($V_o$) is less than the second predetermined voltage value. Namely, the switching apparatus can automatically cut off a path of current from the switching device(s) 20 with exceeding output voltage value(s) to other switching device(s) 20 when the load 9 is removed, and automatically re-establish the path of current when the load 9 is reconnected. Therefore, the switching device 20 according to the disclosure is capable of preventing the internal losses of energy caused by the current backfeeding.

Moreover, each switching device 20 includes the lightning protection circuit 53 and the overcurrent protection circuit 54 that are capable of detecting the voltage spike or the surge current. Upon detection of the voltage spike or the surge current, the control unit 6 can instantly control the switch circuit 2 to operate in the open state, thereby preventing the switching device 20 from damage.

In addition, each of the switching devices 20 includes the input capacitor 51 and the output capacitor 52 that are capable of reducing ripples in the input voltage and the output voltage. Therefore, the switching devices 20 can stabilize the output voltage indeed.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A switching device to be electrically connected to a solar panel for stabilizing an electric output of the solar panel, said switching device comprising:
    a switch circuit operable to switch between a closed state and an open state, and including a first node that is configured to be electrically connected to the solar panel for receiving input voltage and input current therefrom, and a second node;
    a voltage converter circuit electrically connected to said second node for receiving the input voltage and the input current from said switch circuit when said switch circuit is in the closed state, and configured to convert the input voltage and the input current into output voltage and output current; and
    a control unit electrically connected to said switch circuit and said voltage converter circuit, and configured to
        measure an input voltage value of the input voltage, an input current value of the input current, an output voltage value of the output voltage, and an output current value of the output current,
        calculate an input electric power based on the input voltage value and the input current value,
        calculate an output electric power based on the output voltage value and the output current value, and
        control said switch circuit to switch between the closed state and the open state according to the input electric power and the output electric power.

2. The switching device of claim 1, wherein said control unit is configured to repeatedly calculate the input electric power when said switch circuit is in the closed state, and to control said switch circuit to switch to the open state upon a change in a rate of change of the input electric power from a positive value to a negative value.

3. The switching device of claim 2, wherein said control unit is configured to repeatedly calculate the input electric power at successive time points with a specific interval based on $$W_i = \int_0^T I_i(t) V_i(t) dt$$

where $W_i$ denotes the input electric power, $V_i$ denotes the input voltage value, $I_i$ denotes the input current value, and T denotes the specific interval.

4. The switching device of claim 1, wherein said control unit is configured to repeatedly calculate the output electric power when said switch circuit is in the open state, and to control said switch circuit to switch to the closed state upon a change in a rate of change of the output electric power from a positive value to a negative value.

5. The switching device of claim 4, wherein said control unit is configured to repeatedly calculate the output electric power at successive time points with a specific interval based on $$W_o = \int_0^T I_o(t) V_o(t) dt$$

where $W_o$ denotes the output electric power, $V_o$ denotes the output voltage value, $I_o$ denotes the output current value, and T denotes the specific interval.

6. The switching device of claim 1, further comprising an output interface electrically connected to said voltage converter circuit for outputting the output voltage and the output current,
    wherein said control unit includes:
        a control circuit configured to measure the input voltage value of the input voltage and the input current value of the input current, and to calculate the input electric power and the output electric power; and
        an output voltage measuring circuit and an output current measuring circuit that are electrically connected to said control circuit and said output interface, and that are configured to measure the output voltage value and the output current value, respectively, and to transmit the output voltage value and the output current value to said control circuit.

7. The switching device of claim 6, wherein said control circuit is electrically connected to said switch circuit, and is configured to control said switch circuit to switch between the closed state and the open state.

8. The switching device of claim 7, wherein said control circuit is further configured to control said switch circuit to operate in the open state when the output voltage value is greater than a first predetermined voltage value, and to operate in the closed state when the output voltage value is less than a second predetermined voltage value that is less than the first predetermined voltage value.

9. The switching device of claim 7, further comprising a protection circuit configured to be electrically connected in parallel with the solar panel for detecting a surge,
    wherein said control circuit is further configured to control said switch circuit to operate in the open state when a value of the surge detected by said protection circuit is greater than a surge threshold.

10. A switching apparatus comprising a plurality of switching devices, each of said switching devices being electrically connected to a solar panel for stabilizing an electric output of the solar panel, each of said switching devices including:
    a switch circuit operable to switch between a closed state and an open state, and including a first node that is configured to be electrically connected to the solar panel for receiving input voltage and input current therefrom, and a second node;

a voltage converter circuit electrically connected to said second node for receiving the input voltage and the input current from said switch circuit when said switch circuit is in the closed state, and configured to convert the input voltage and the input current into output voltage and output current; and a control unit electrically connected to said switch circuit and said voltage converter circuit, and configured to measure an input voltage value of the input voltage, an input current value of the input current, an output voltage value of the output voltage, and an output current value of the output current, calculate an input electric power based on the input voltage value and the input current value, calculate an output electric power based on the output voltage value and the output current value, and control said switch circuit to switch between the closed state and the open state according to the input electric power and the output electric power.

11. The switching apparatus of claim 10, wherein said control unit is configured to repeatedly calculate the input electric power when said switch circuit is in the closed state, and to control said switch circuit to switch to the open state upon a change in a rate of change of the input electric power from a positive value to a negative value.

12. The switching apparatus of claim 11, wherein said control unit is configured to repeatedly calculate the input electric power at successive time points with a specific interval based on $$W_i = \int_0^T I_i(t) V_i(t) dt$$

where $W_i$ denotes the input electric power, $V_i$ denotes the input voltage value, $I_i$ denotes the input current value, and T denotes the specific interval.

13. The switching apparatus of claim 10, wherein said control unit is configured to repeatedly calculate the output electric power when said switch circuit is in the open state, and to control said switch circuit to switch to the closed state upon a change in a rate of change of the output electric power from a positive value to a negative value.

14. The switching device of claim 13, wherein said control unit is configured to repeatedly calculate the output electric power at successive time points with a specific interval based on $$W_o = \int_0^T I_o(t) V_o(t) dt$$

where $W_o$ denotes the output electric power, $V_o$ denotes the output voltage value, $I_o$ denotes the output current value, and T denotes the specific interval.

15. The switching apparatus of claim 10, further comprising an output interface electrically connected to said voltage converter circuit for outputting the output voltage and the output current, wherein said control unit includes:

a control circuit configured to measure the input voltage value of the input voltage and the input current value of the input current, and to calculate the input electric power and the output electric power; and an output voltage measuring circuit and an output current measuring circuit that are electrically connected to said control circuit and said output interface, and that are configured to measure the output voltage value and the output current value, respectively, and to transmit the output voltage value and the output current value to said control circuit.

16. The switching device of claim 15, wherein said control circuit is electrically connected to said switch circuit, and is configured to control said switch circuit to switch between the closed state and the open state.

17. The switching device of claim 16, wherein said control circuit is further configured to control said switch circuit to operate in the open state when the output voltage value is greater than a first predetermined voltage value, and to operate in the closed state when the output voltage value is less than a second predetermined voltage value that is less than the first predetermined voltage value.

18. The switching device of claim 16, further comprising a protection circuit configured to be electrically connected in parallel with the solar panel for detecting a surge, wherein said control circuit is further configured to control said switch circuit to operate in the open state when a value of the surge detected by said protection circuit is greater than a surge threshold.

* * * * *